US006693334B2

(12) United States Patent
Sasaki (10) Patent No.: US 6,693,334 B2
(45) Date of Patent: Feb. 17, 2004

(54) SEMICONDUCTOR INTEGRATED CIRCUIT DEVICE (75) Inventor: Hirofumi Sasaki, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 8 days.

(21) Appl. No.: 10/201,284

(22) Filed: Jul. 24, 2002

(65) Prior Publication Data

US 2003/0020098 A1 Jan. 30, 2003

(30) Foreign Application Priority Data

Jul. 25, 2001 (JP) ........................................ 2001-225204

(51) Int. Cl.$^7$ .............................................. H01L 29/76
(52) U.S. Cl. ...................... 257/409; 287/503; 287/774
(58) Field of Search ................... 257/409, 503, 257/774

(56) References Cited

U.S. PATENT DOCUMENTS 5,242,540 A * 9/1993 Ishii et al.
5,828,108 A 10/1998 Toyoda

FOREIGN PATENT DOCUMENTS

| JP | 9-107070 A | 4/1997 |
| JP | 2000-307063 A | 11/2000 |

* cited by examiner

Primary Examiner—Fetsum Abraham
(74) Attorney, Agent, or Firm—Foley & Lardner

(57) ABSTRACT

A shield portion 5 has such a multi-layer wiring construction comprised of three wiring layers as to correspond to a macro cell and also via contacts formed with a predetermined spacing therebetween and is supplied with a predetermined potential (for example, a ground potential) but not connected to a power wiring or a ground wiring in the macro cell. This configuration makes it possible to hold the wiring layers of the shield portion at roughly the same potential. Accordingly, noise originated from the wiring layer as a signal line is blocked in propagation by the shield portion and so does not affect a signal flowing through a wiring layer.

12 Claims, 11 Drawing Sheets

SEMICONDUCTOR INTEGRATED CIRCUIT DEVICE

BACKGROUND OF THE INVENTION

1. Field of the Invention

The present invention relates to a semiconductor integrated circuit device provided with, for example, a macro cell having a multi-layer construction.

The present application claims priority of Japanese Patent Application No. 2001-225204 filed on Jul. 25, 2001, which is hereby incorporated by reference.

2. Description of the Related Art

A semiconductor integrated circuit device such as a system LSI (Large Scale Integrated Circuit) has such a configuration that a plurality of macro cells having a specific function is formed on a substrate. In each of the macro cells, such elements are formed as a transistor, a resistor, a capacitor, or a like, which are combined to make up a memory circuit of a RAM/DRAM, a variety of operation circuits, or a like.

The macro cells are supplied with power through a power wiring formed in a wiring region provided outside a macro cell region, in which wiring region is also formed a signal wiring for transmitting a signal between these macro cells.

Figure 13:
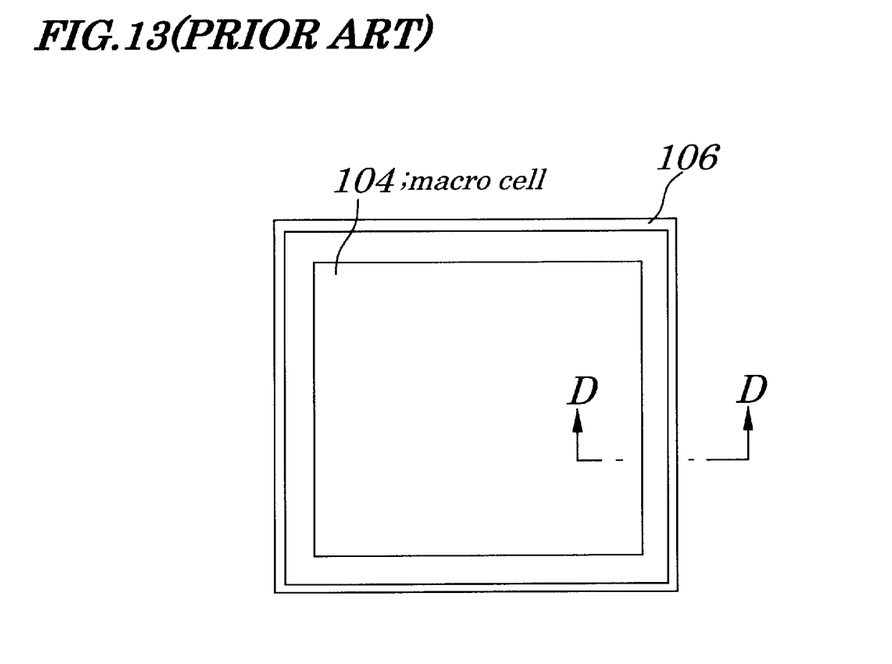
FIG. 13 is an illustration for explaining a conventional technology.
Figure 14:
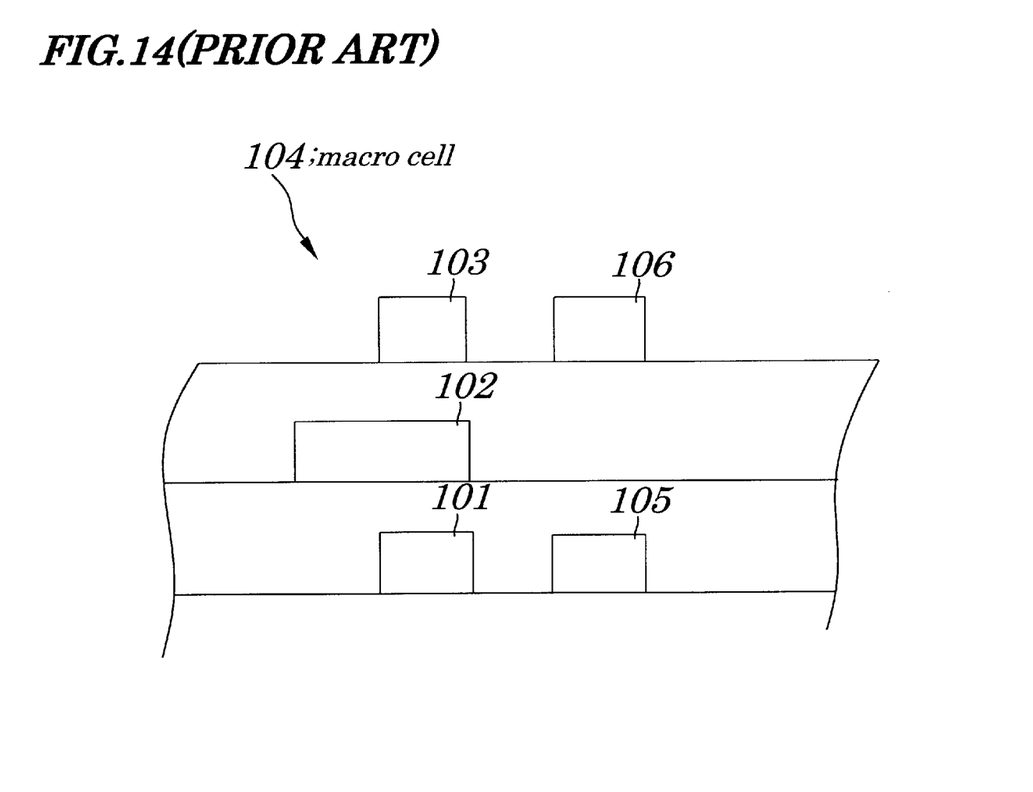
FIG. 14 is an expanded cross-sectional view for explaining the conventional technology taken along line D—D of FIG. 13.

For example, Japanese Patent Application Laid-open No. 2000-307063 discloses a technology for arranging ring-shaped wiring layers 105 and 106 for supplying power such that ring-shaped wiring layers 105 and 106 surround respectively a macro cell 104 having a multi-layer wiring-construction made up of three wiring layers 101, 102, and 103 as shown in FIGS. 13 and 14. These ring-shaped wiring layers 105 and 106 are connected to a power wiring or a ground wiring of at least one of other macro cells and functional blocks which are disposed around the macro cell 104.

Figure 15:
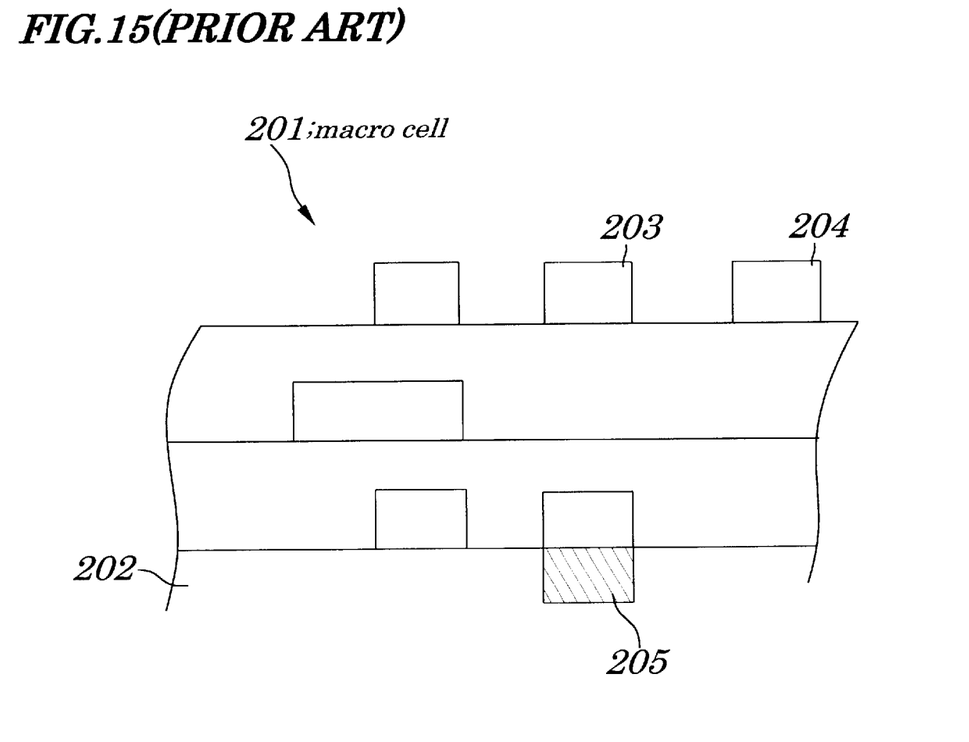
FIG. 15 is an illustration for explaining the conventional technology.

Furthermore, Japanese Patent Application Laid-open No. Hei 09-107070 discloses a technology for providing a ring-shaped diffused layer surrounding a macro cell. In a macro cell 201 having a multi-layer wiring-construction, as shown in FIG. 15, a substrate 202 is mounted thereon with a power wiring for other macro cells and functional blocks, ring-shaped wiring layers 203 and 204 connected to the ground wiring and also mounted therein with a ring-shaped diffused layer 205 below these ring-shaped wiring layers 203 and 204.

This diffused layer 205 is biased as connected to the ring-shaped wiring layer 203 (204) connected to no other elements of the macro cell 201, thus absorbing noise occurring in the macro cell 201.

As the LSI processes improve in fine patterning and integration density, however, coupling capacitance between adjacent signal lines increases to have a non-negligible adverse effect on the circuit reliability; nevertheless, the above-mentioned conventional technologies have no measures to prevent noise from propagating, for example, between a signal wiring in a macro cell and an adjacent external signal wiring.

Although the above-mentioned technology disclosed in Japanese Patent Application Laid-open No. 2000-307063 can prevent noise on the power wiring or the ground wiring of the macro cell 104 from propagating through the ring-shaped wiring layers 105 and 106 to any other macro cells, functional blocks, or signal wirings disposed around the macro cell 104, it has a problem that an external signal wiring, if any, adjacent to an internal signal wiring of the macro cell 104 permits the noise to propagate owing to coupling capacitance generated between these wirings, thus causing the malfunctioning of the macro cells or the functional blocks or the retardation and inversion of a signal through the signal wiring.

Figure 16:
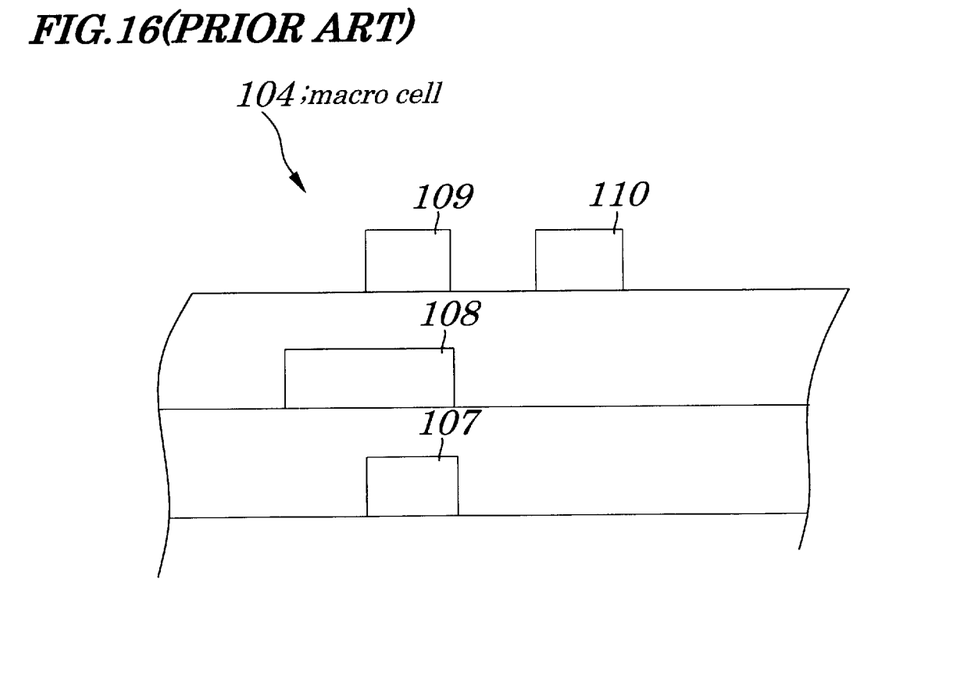
FIG. 16 is another illustration for explaining the conventional technology.
Figure 17:
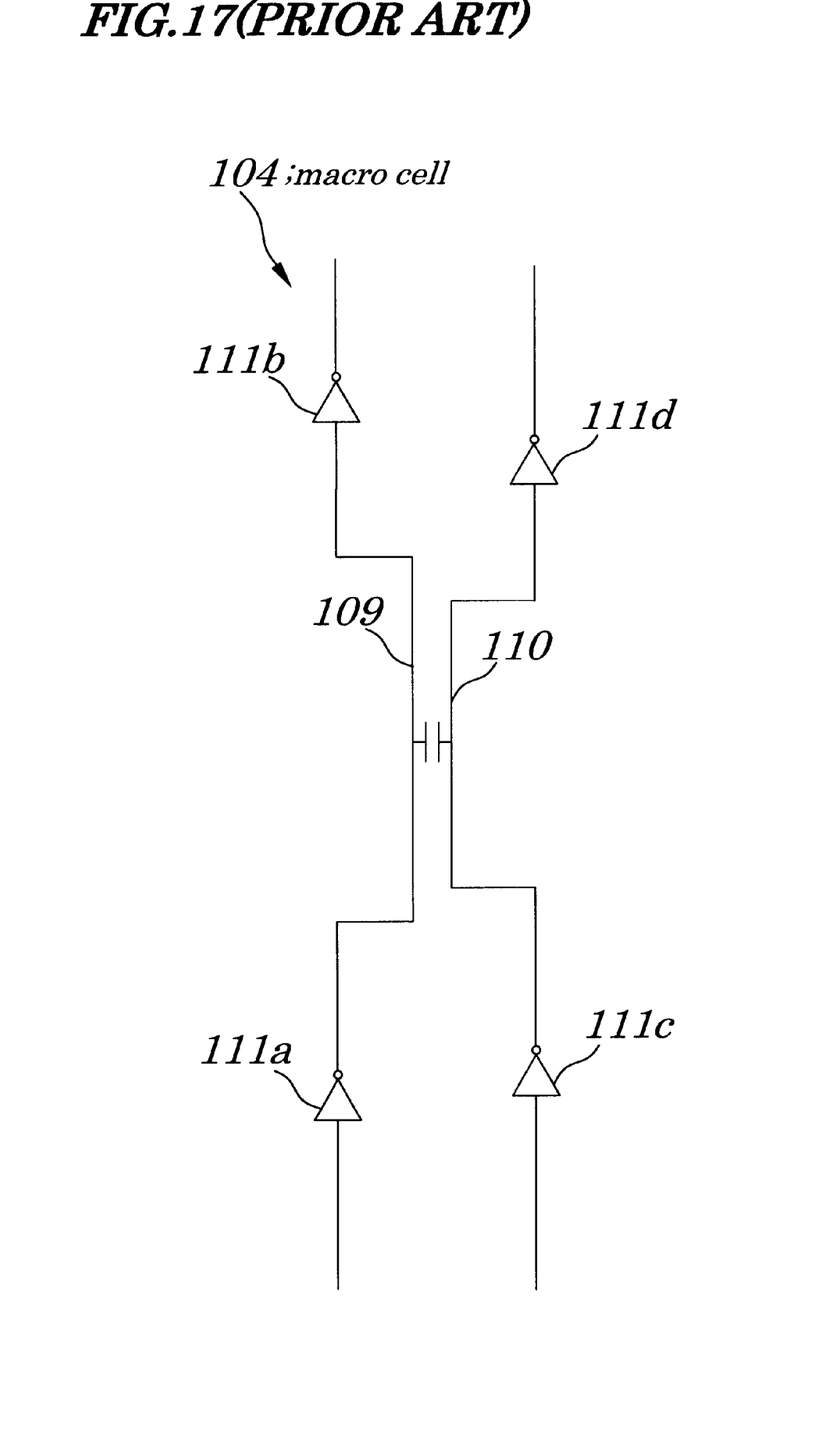
FIG. 17 is a further illustration for explaining the conventional technology.

That is, if a wiring layer 110 of the external signal line of the macro cell 104 is close to its signal line wiring layers 107, 103, and 109 at its predetermined position as shown in FIG. 16, coupling capacitance occurs which is proportional to a distance of a parallel going section where, for example, the wiring layer 109 and the wiring layer 110 are close to each other and also which is roughly inversely proportional to a logarithm of a spacing between the two as shown in FIG. 17.

This coupling capacitance causes noise to propagate between, for example, the wiring layers 109 and 110 to cause useless retardation or mistaken inversion of the signal in a logic circuit 111a (111b, 111c, 111d) such as shown in FIG. 17, for example, thus having a worse influence as a clock signal frequency becomes larger.

Although the technology disclosed in Japanese Patent Application Laid-Open No. Hei 9-107070, on the other hand, can prevent noise from propagating through the substrate 202, it still has a problem that the above-mentioned coupling capacitance which occurs between the adjacent signal wirings causes to noise to propagate, thus causing the malfunctioning of the adjacent macro cells or the functional blocks or the retardation or inversion of the signal along the signal wiring.

SUMMARY OF THE INVENTION

In view of the above, it is an object of the present invention to provide a high-reliability semiconductor integrated circuit device that can block the propagation of noise that occurs in a macro cell, to thereby prevent the noise from having an adverse effect on the adjacent macro cells, the adjacent functional blocks and adjacent signal wirings.

According to a first aspect of the present invention, there is provided a semiconductor integrated circuit device including:

a functional block in which a plurality of semiconductor elements is formed on a semiconductor substrate and connected with each other by a multi-layer wiring; and a multi-layer shield portion which is arranged so as to surround the functional block and in which shielding wiring layers are stacked vertically via an inter-layer insulation film, wherein the multi-layer shield portion is provided with a plurality of via contacts for interconnecting vertically positioned ones of the plurality of shielding wiring layers of the multi-layer shield portion.

In the foregoing, a preferable mode is one wherein the functional block is a macro cell.

A preferable mode is one wherein the via contacts are provided in a circumferential direction of the shielding wiring layers of the multi-layer shield portion with a predetermined spacing therebetween.

A preferable mode is one wherein the via contacts are provided so as to be connected with each other from an uppermost shielding wiring layer to a lowermost shielding wiring layer making up the multi-layer shield portion at an approximately same position as viewed in a plane.

A preferable mode is one wherein the multi-layer shield portion has a notch through which a wiring layer can pass so as to connect to a terminal provided in the functional block.

A preferable mode is one wherein each of the shielding wiring layers of the multi-layer shield portion is formed in a same layer as corresponding one of the multi-layer wirings of the functional block.

A preferable mode is one wherein the multi-layer shield portion is supplied with a predetermined potential but has each of the shielding wiring layers thereof not connected to a power supply terminal or a ground terminal connected to the semiconductor elements formed in the functional block.

A preferable mode is one that wherein further includes a plate-shaped shield portion formed of a plate-shaped shielding wiring layer that covers a top surface of the functional block partially or completely.

A preferable mode is one that wherein the plate-shaped shield portion is supplied with a predetermined potential but not connected to the power supply terminal or the ground terminal connected to the semiconductor elements formed in the functional block.

A preferable mode is one that wherein a tunnel-shaped shield portion is provided in the functional block for accommodating an external wiring layer connected to a circuit outside the functional block in such a manner that the external wiring layer may pass through the functional block along the semiconductor substrate; and the tunnel-shaped shield portion is provided along a wiring path of the external wiring layer above the external wiring layer, having an upper-part shielding wiring layer consisting of an elongated plate-shaped wiring layer, one pair of side-part shielding wiring layers provided each on two sides of the external wiring layer and arranged parallel to the external wiring layer, and a plurality of via contacts for interconnecting the upper-part shielding wiring layer and each of the side-part shielding wiring layers.

A preferable mode is one that wherein the external wiring layer is arranged in a layer except a lowermost layer on the semiconductor substrate and has below a lower-part shielding wiring layer formed of an elongated plate-shaped wiring layer along a path of the external wiring layer.

A preferable mode is one that wherein the tunnel-shaped shield portion is supplied with a predetermined potential but not connected to the power supply terminal or the ground terminal connected to the semiconductor elements formed in the functional block.

With the above configurations, it is possible to prevent noise from propagating between, for example, two different functional blocks which are adjacent to each other.

That is, noise originated from a wiring layer in a functional block as a signal line is blocked in propagation by the multi-layer shield portion and so prevented from affecting a signal flowing through a wiring layer outside the functional block. Accordingly, it is possible to eliminate such adverse effects of causing the malfunctioning of the functional blocks and a like, or the retardation and inversion of the signal.

In addition, a signal flowing through the wiring layer in the functional block is not influenced by the noise originated from the wiring layer outside the functional block.

BRIEF DESCRIPTION OF THE DRAWINGS

The above and other objects, advantages, and features of the present invention will be more apparent from the following description taken in conjunction with the accompanying drawings, in which.

DESCRIPTION OF THE PREFERRED EMBODIMENTS

Best mode of carrying out the present invention will be described in further detail using various embodiments with reference to the accompanying drawings.

First Embodiment

Figure 1:
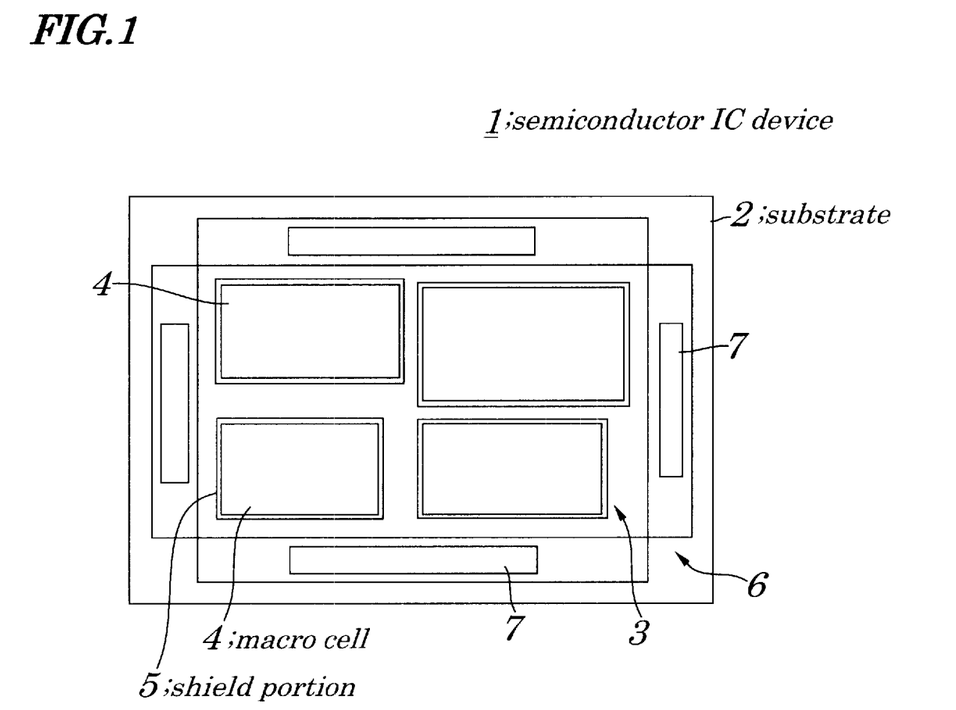
FIG. 1 is a plan view for showing a configuration of a semiconductor integrated circuit device according to a first embodiment of the present invention.
Figure 2:
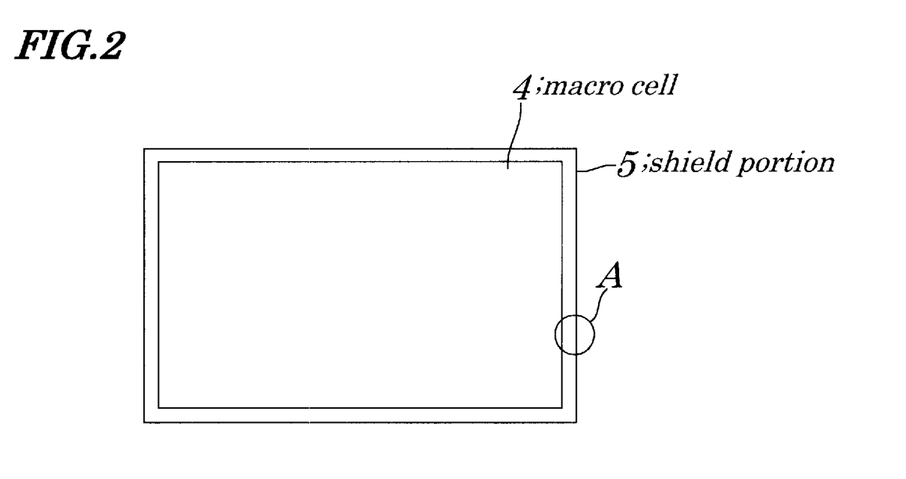
FIG. 2 is a plan view for showing a configuration of a macro cell and a shield portion of the semiconductor integrated circuit device of FIG. 1.

A semiconductor integrated circuit device 1 according to the present embodiment is a semiconductor chip such as a system LSI and, as shown in FIGS. 1 and 2, is arranged in a core region 3 on a substrate (semiconductor substrate) 2, comprising a plurality of macro cells (functional blocks) 4 having a specific function such as a RAM, a DRAM or a like, a rectangular shield ring (multi-layer shield) 5 disposed so as to surround each macro cell 4 in order to reduce noise occurring therein, and a plurality of input/output circuits 7 disposed in an interface region on the substrate 2.

Figure 3:
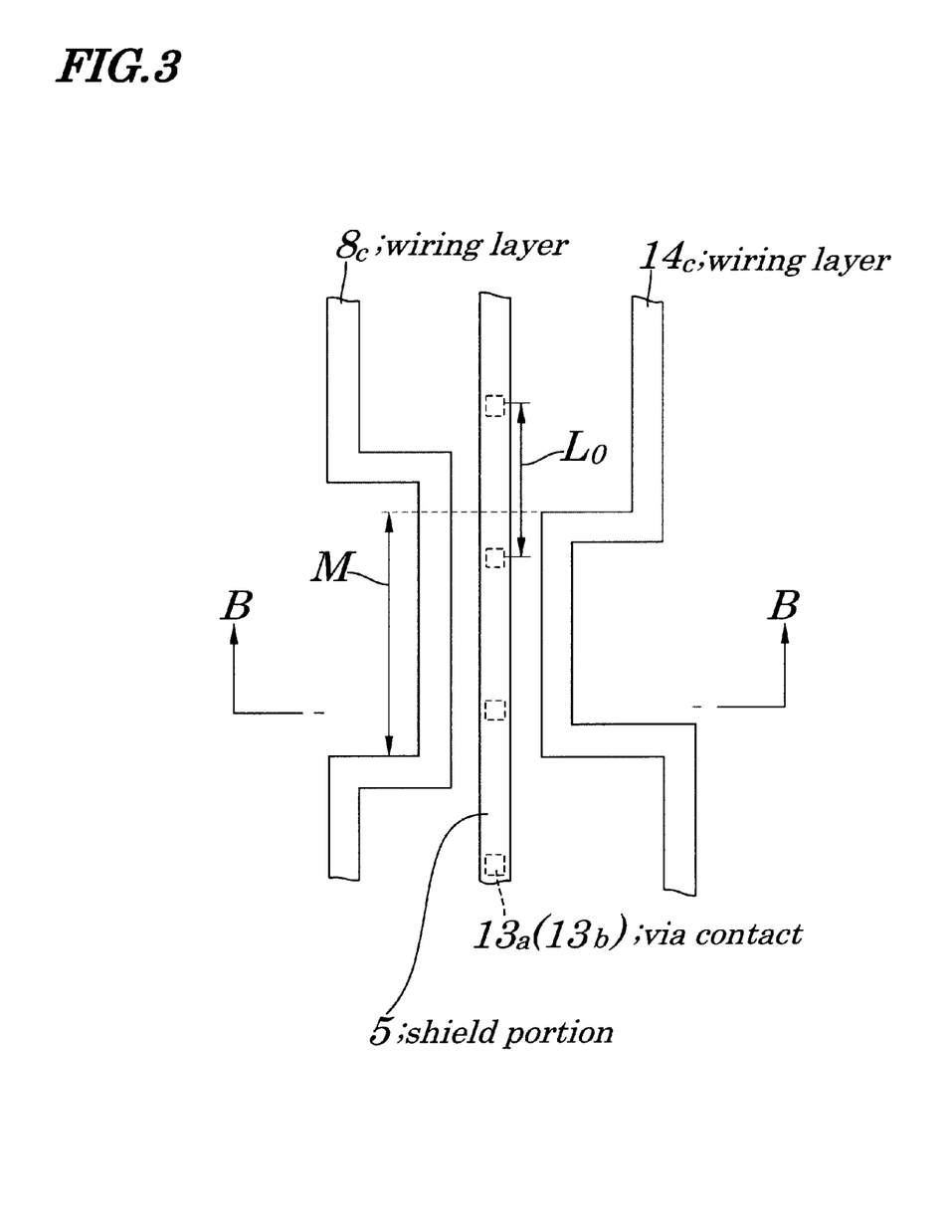
FIG. 3 is an expanded plan view of part A of FIG. 2.
Figure 4:
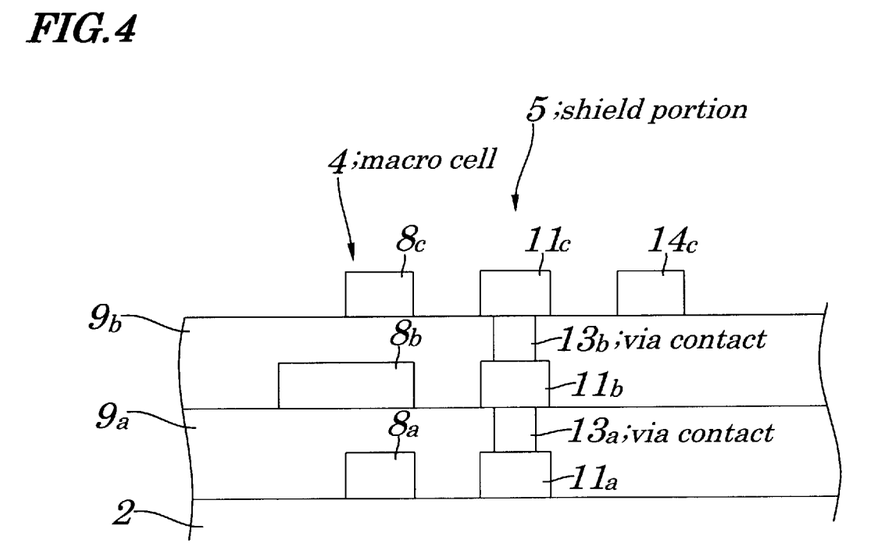
FIG. 4 is a cross-sectional view taken along line B—B of FIG. 3.

The macro cells 4 each have a multi-layer wiring construction having, for example, three wiring layers. That is, as shown in FIGS. 3 and 4, on the substrate 2 is formed a wiring layer 8a, above which is formed via an inter-layer insulation film 9a a wiring layer 8b, above which is in turn formed a wiring layer 8c via an inter-layer insulation film 9b. The wiring layers 8a, 8b, and 8c are made of, for example, aluminum and all used as a signal line in the present embodiment.

The shield portion 5 is disposed so as to surround the macro cell 4 with its multi-layer wiring construction having three wiring layers that correspond to the wiring layers of the macro cell 4. That is, as shown in FIG. 4, on the substrate 2 is formed a wiring layer (shielding wiring layer) 11a, above which is formed via the inter-layer insulation film 9a a wiring layer (shielding wiring layer) 11b, above which is in turn formed a wiring layer (shielding layer) 11c via the inter-layer insulation film 9b.

These wiring layers 11a, 11b, and 11c are arranged in the same layers as the wiring layers 8a, 8b, and 8c of the macro cell 4 respectively and formed simultaneously respectively.

As shown in FIGS. 3 and 4, in the inter-layer insulation film 9a between the wiring layers 11a and 11b and the inter-layer insulation film 9b between the wiring layers 11b and 11c are formed via contacts 13a and 13b with a predetermined spacing L0 therebetween to interconnect the wiring layers 11a and 11b and the wiring layers 11b and 11c respectively.

The via contacts 13a and 13b are formed by making an opening in the inter-layer insulation films 9a and 9b respectively and filling them with the same conductive material as the wiring layers 11a, 11b, and 11c.

The shield portion 5 is connected to a predetermined potential (for example, the ground potential) but not to a power wiring or a ground wiring in the macro cell 4.

This configuration makes it possible to hold the wiring layers 11a, 11b, and 11c of the shield portion 5 at roughly the same potential at each site.

In the present embodiment, as shown in FIGS. 3 and 4, at a periphery of the macro cell 4 is present such a position that the wiring layers 8a, 8b, and 8c used as a signal line disposed inside the macro cell 4 and a wiring layer 14c used as a signal line disposed outside the macro cell 4 run close and parallel to each other in a parallel-going section M having a predetermined length.

Even at such a position that the wiring layer inside the macro cell 4 is near the wiring line outside the macro cell 4, the shield portion 5 exists between, for example, the wiring layers 8a, 8b, and 8c and the wiring layer 14c.

Even if noise occurs due to fluctuations in signal level between the wiring layer 8a (8b, 8c) and the wiring layer 14c running parallel as sandwiching the shield portion 5, the noise is prevented by the shield portion 5 from propagating so that the wiring layer 8a (8b, 8c) and the wiring layer 14c may not interfere with each other adversely.

Note here that the wiring layer 14c is formed at the same time as the wiring layer 8c of the macro cell 4 and the wiring layer 11c of the shield portion 5.

Figure 5:
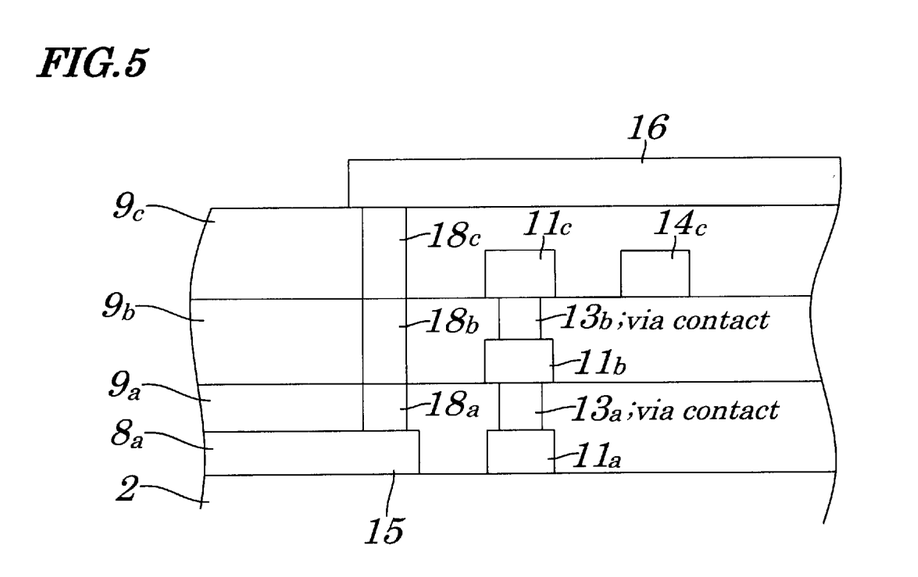
FIG. 5 is a cross-sectional view for showing a configuration of a vicinity of a terminal portion of the macro cell.

In the present embodiment, as shown in FIG. 5, the substrate 2 has a terminal portion 15 formed thereon for inputting/outputting a signal and also has a wiring layer 16 as a signal line connected to an external circuit of the macro cell 4 formed above the wiring layers 11c and 14c via the inter-layer insulation film 9c. The wiring layer 16 is connected to the terminal portion 15 through via contacts 18a, 18b, and 18c formed in the inter-layer insulation films 9a, 9b, and 9c respectively.

Similarly, wiring layers for the power supply and the ground are also drawn from the upper surface side into the macro cell 4 to be connected to the power supply terminal portion.

The following will describe how to manufacture a semiconductor integrated circuit device according to the present embodiment, in particular, how to form the shield portion.

Figure 6A:
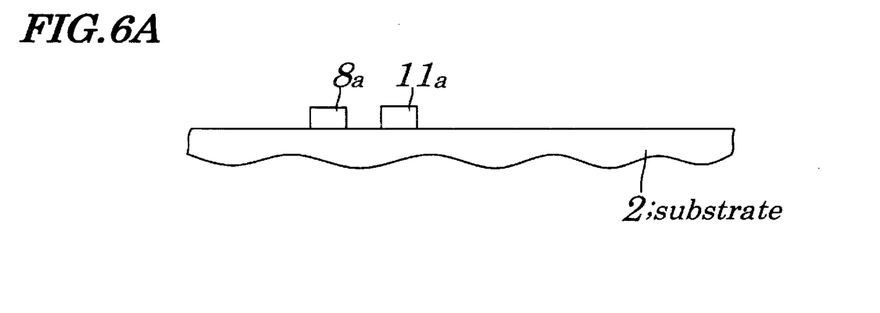
FIGS. 6A to 6F are flow diagrams for showing a method for manufacturing the semiconductor integrated circuit device.

First, as shown in FIG. 6A, a conductive layer made of such as aluminum or a like is formed on the substrate 2 by sputtering and then processed by photolithography to form the wiring layers 8a and 11a.

Figure 6B:
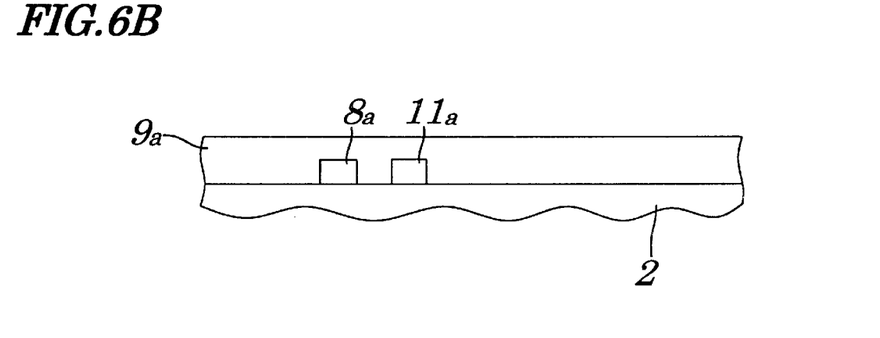

Next, as shown in FIG. 6B, for example, a silicon nitride film is formed throughout the surface by CVD (Chemical Vapor Depositon) and then, if necessary, etched back to be flattened, thus forming the inter-layer insulation film 9a.

Figure 6C:
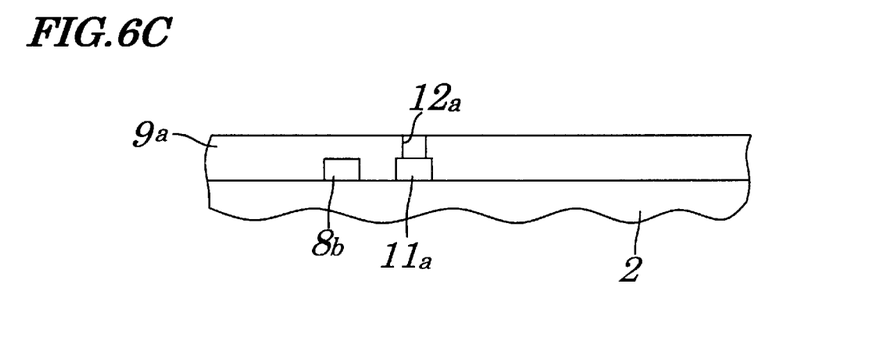

Next, as shown in FIG. 6C, the inter-layer insulation film 9a is etched off so as to expose the surface of the wiring layer 11a, thus forming an opening 12a. The openings 12a are arranged in a circumferential direction of the wiring layer 11a with the predetermined spacing L0 therebetween.

Figure 6D:
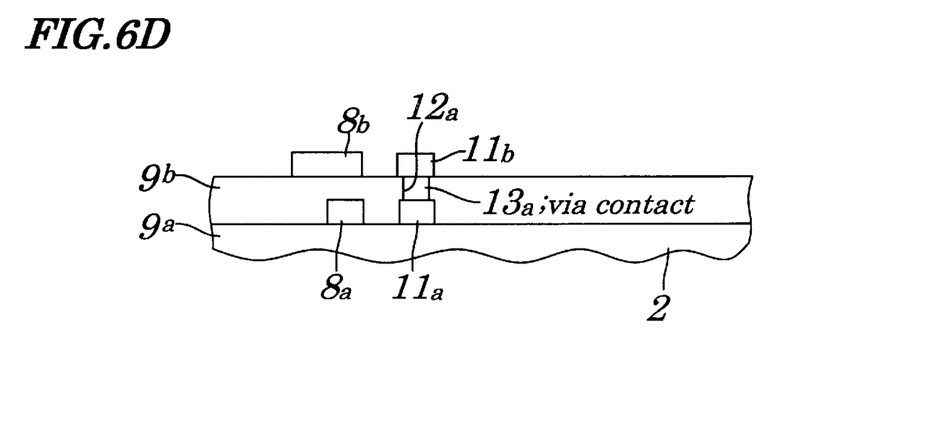

Next, as shown in FIG. 6D, for example, aluminum is poured into the opening 12a to provide the via contact 13a and also patterned to form the wiring layers 8b and 11b by photolithography.

Figure 6E:
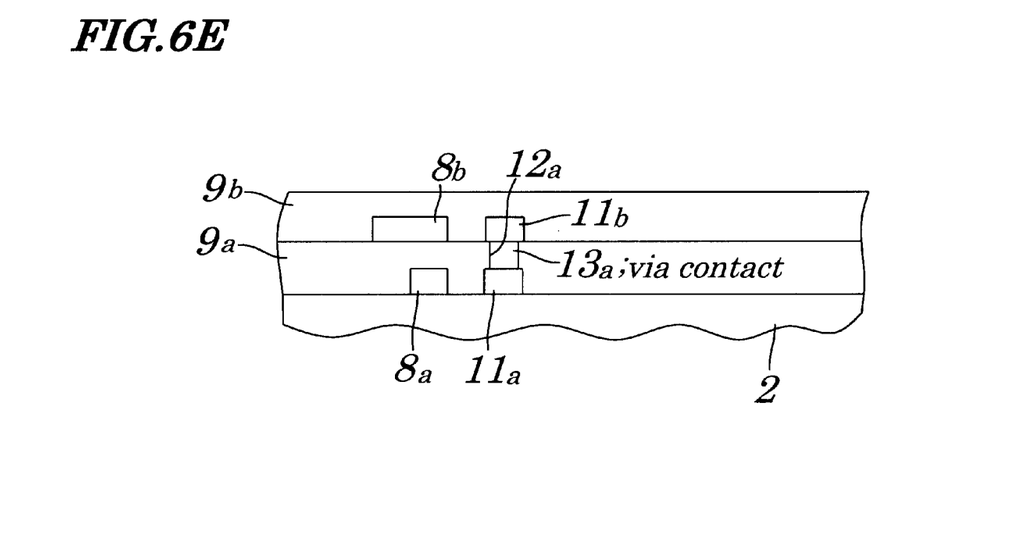

Next, as shown in FIG. 6E, for example, a silicon nitride film is formed throughout the surface by CVD and then, if necessary, etched back to be flattened, thus forming the inter-layer insulation film 9b.

Figure 6F:
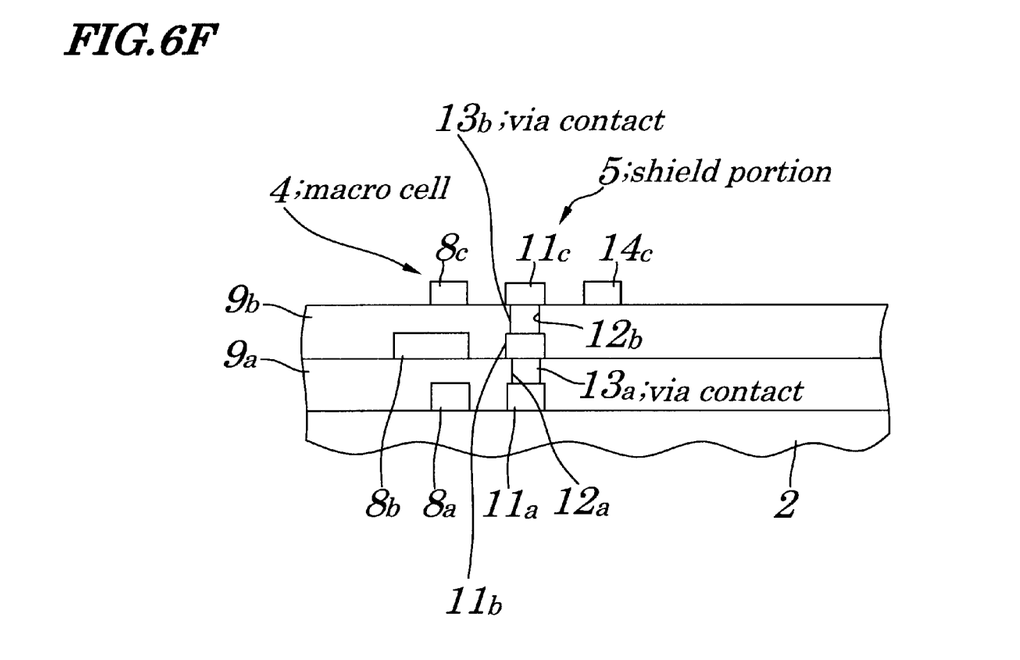

Next, as shown in FIG. 6F, the inter-layer insulation film 9b is etched to expose the surface of the wiring layer 11b, thus forming an opening 12b. The opening 12b is provided directly above the opening 12a via the wiring layer 11b.

Next, for example, aluminum is poured into the opening 12b to provide the via contact 13b and also patterned to form the wiring layers 8c, 11c, and 14c by photolithography.

Accordingly, the shield portion 5 is formed having a multi-layer wiring construction comprised of the three wiring layers 11a, 11b, and 11c, which are consecutively connected through the via contacts 13a and 13b provided with the predetermined spacing L0 therebetween.

The following will describe operations of the semiconductor integrated circuit device according to the present embodiment.

As mentioned above, the shield portion 5 has such a multi-layer wiring construction comprised of the three-layered wiring layers 11a, 11b, and 11c as to correspond to that of the macro cell 4 and the via contacts 13a and 13b formed therein with the predetermined spacing therebetween and is connected to a predetermined potential (for example, a ground potential) but not connected to a power wiring or a ground wiring provided in the macro cell 4.

This configuration makes it possible to hold the wiring layers 11a, 11b, and 11c of the shield portion 5 at roughly the same potential.

As shown in FIG. 3, therefore, even at a position where, for example, the wiring layer 8c provided as an internal signal line of an arbitrary one of the macro cells 4 is close to the wiring layer 14c provided as an external signal line of the arbitrary one of the macro cells 4, the shield portion 5 interposed between these two signal lines (wiring layers 8c and 14c) prevents crosstalk noise between two signals on signal lines (wiring layers 8c and 14c) from occuring.

For example, noise originated from any one of the wiring layers 8c, 8b, and 8a as a signal line is prevented by the shield portion 5 from propagating over to the wiring layer 14c as a signal line.

Accordingly, this noise does not interfere with a signal flowing through the wiring line 14c.

Thus, with the configuration of this embodiment, as the shield portion 5 is interposed between two signal lines (wiring layers 8c and 14c), it is possible to prevent crosstalk noise between, for example, the macro cell 4, and adjacent macro cells or adjacent functional blocks.

That is, the shield portion 5 has such a multi-layer wiring construction comprised of the three-layered wiring layers 11a, 11b, and 11c as to correspond to that of the macro cell 4 and the contacts 13a and 13b formed therein with the predetermined spacing therebetween and is connected to a predetermined potential (for example, a ground potential) but not connected to a power wiring or a ground wiring provided in the macro cell 4.

This configuration makes it possible to hold the wiring layers 11a, 11b, and 11c of the shield portion 5 at roughly the same potential.

Accordingly, noise originated from any one of the wiring layers 8c, 8b, and 8a provided as a signal line is blocked by the shield portion 5 in propagation and so does not interfere with a signal flowing through the wiring line 14c.

This in turn makes it possible to eliminate adverse effects such as the malfunctioning of the macro cells or functional blocks or the retardation or inversion of a signal.

On the other hand, signals flowing through the wiring layers 8c, 8b, and 8a is not affected by a signal flowing through the wiring layer 14c.

Second Embodiment

Figure 7:
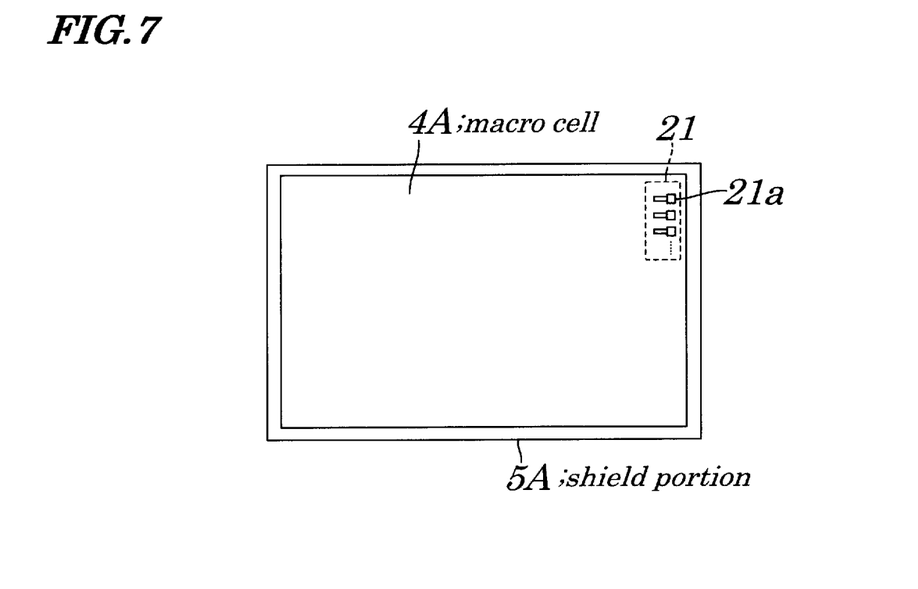
FIG. 7 is a plan view for showing a configuration of a macro cell and a shield portion of a semiconductor integrated circuit device according to a second embodiment of the present invention.
Figure 8:
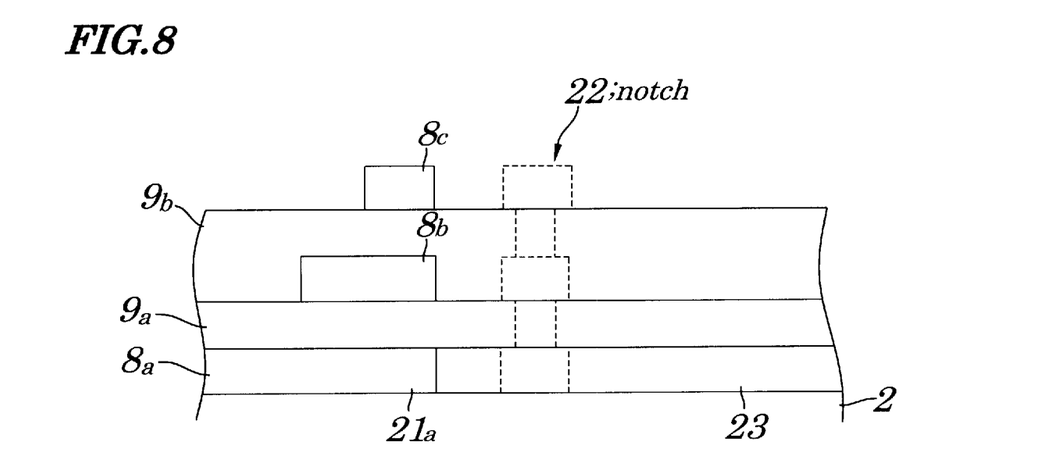
FIG. 8 is a cross-sectional view for showing an important part of the macro cell and the shield portion.

The present embodiment greatly differs from the above-mentioned first embodiment in a respect that, as shown in FIGS. 7 and 8, a notch 22 is formed in a shield portion 5A so as to pass through it a wiring layer as a signal line for connecting to a terminal portion 21 of a macro cell 4A.

Except this point, the configuration of the present embodiment is roughly the same as that of the above-mentioned first embodiment and its explanation is simplified here.

As shown in FIG. 7, the macro cell 4A of the present embodiment is formed in a predetermined region on the substrate 2 and has a terminal portion 21 comprised of, for example a plurality of terminals 21a.

As shown in FIG. 8, a shield portion 5A has a notch 22 at a site that corresponds to that where the terminal portion 21 is disposed for connection to a circuit outside a macro cell 4A, through which notch 22, for example, a wiring layer 23 as a signal line passes to connect to the terminal 21a.

The wiring layer 23 is formed in the same layer as the terminal portion 21 on the substrate 2 so as to connect to the terminal 21a.

This configuration of the present embodiment gives almost the same effects as those of the above-mentioned first embodiment.

Besides, the present embodiment eliminates the necessity of forming a wiring layer as a signal line above, for example, the shield portion 5A, thus improving the wiring efficiency Furthermore, it does not increase the number of processes required.

Third Embodiment

Figure 9:
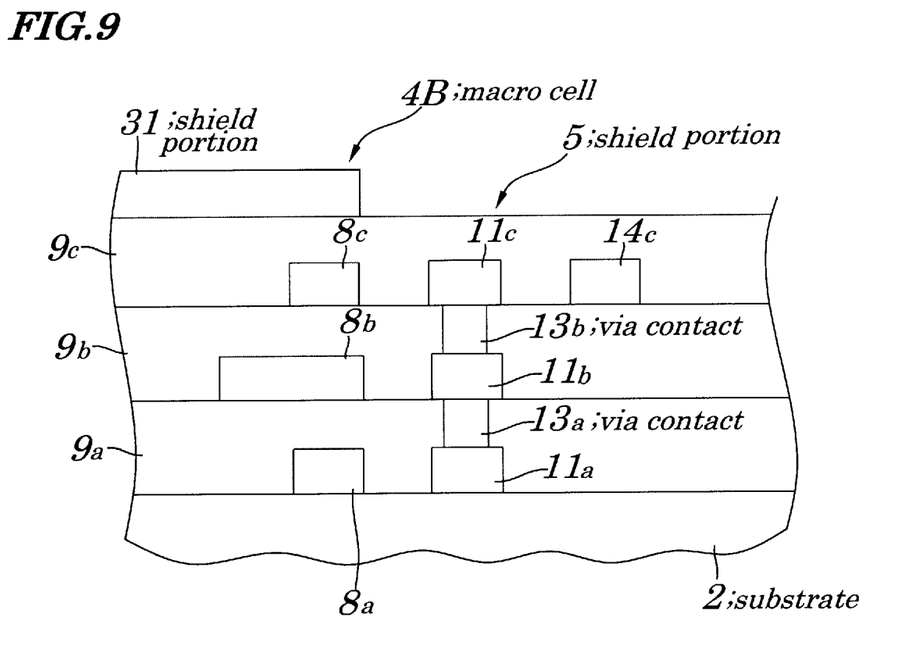
FIG. 9 is a cross-sectional view for showing a configuration of an important part of a macro cell and a shield portion of a semiconductor integrated circuit device according to a third embodiment of the present invention.

The present embodiment greatly differs from the above-mentioned first embodiment in a respect that, as shown in FIG. 9, a macro cell 4B is formed above the wiring layers 8c, 11c, and 14c via the inter-layer insulation layer 9c and has a plate-shaped shield portion 31 covering the macro cell 4B completely.

Except it, the configuration of the present embodiment is roughly the same as that of the above-mentioned first embodiment and its explanation is omitted here.

This configuration of the present embodiment gives almost the same effects as those of the above-mentioned first embodiment.

Besides, noise occurring in the macro cell 4B is blocked in propagation by the plate-shaped shield portion 31 and so does not affect a signal flowing through an external wiring layer, if any, disposed above the macro cell 4B. It is thus possible to securely eliminate adverse effects which cause the malfunctioning of the other macro cells or functional blocks or the retardation or inversion of the signal.

Furthermore, noise coming toward the inside of the macro cell 4B from the above is blocked in propagation by the plate-shaped shield portion 31, so that a signal flowing through a wiring layer in the macro cell 4B is not affected by noise originated from a wiring layer outside the macro cell 4B.

Fourth Embodiment

Figure 10:
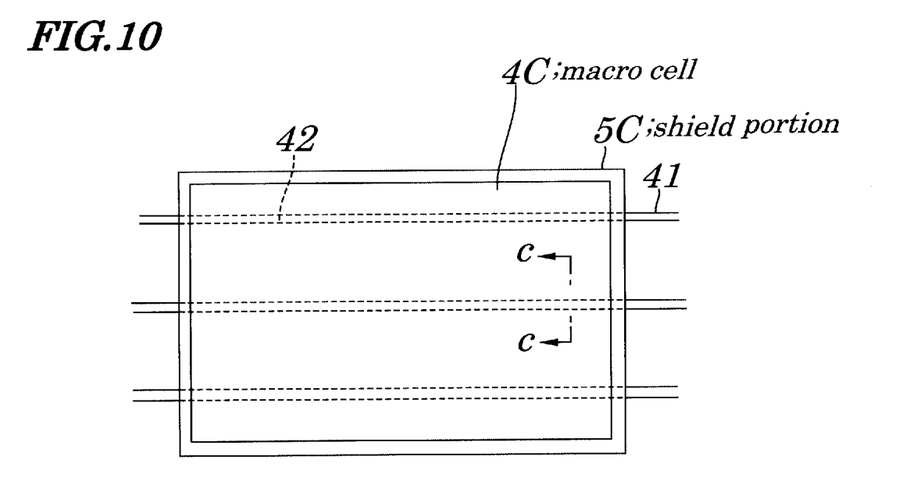
FIG. 10 is a plan view for showing a configuration of a macro cell and a shield portion of a semiconductor integrated circuit device according to a fourth embodiment of the present invention.

The present embodiment greatly differs from the above-mentioned first embodiment in a respect that, as shown in FIG. 10, a macro cell 4C has a tunnel-shaped shield portion 42 in which a wiring layer connected with an external circuit can pass through the macro cell 4C along the substrate 2.

Except this point, the configuration of the present embodiment is roughly the same as that of the above-mentioned first embodiment and so its explanation is simplified here.

Figure 11:
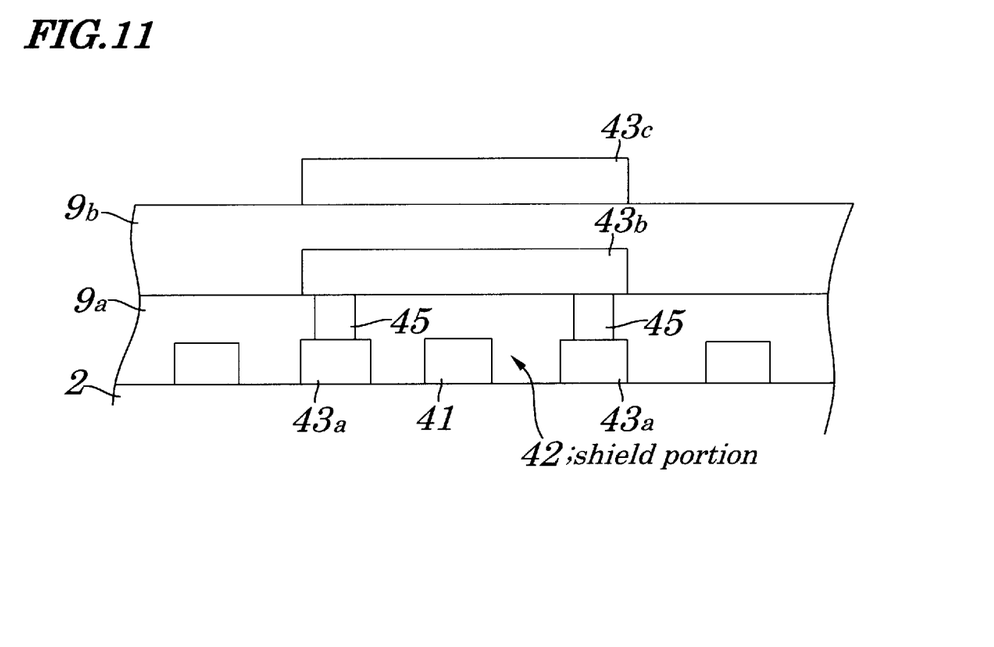
FIG. 11 is a cross-sectional view taken along line C—C of FIG. 10.

As shown in FIG. 11, the tunnel-shaped shield portion 42 has a plurality of wiring layers 43a disposed parallel with a predetermined spacing therebetween and a wiring layer 43b formed above these wiring layers 43a via the inter-layer insulation film 9a in the same layer as the intermediate wiring layers. The wiring layers 43a are connected with the wiring layer 43b through via contacts 45 formed in the inter-layer insulation film 9a.

The via contacts 45 are disposed in the length direction of the shield portion 42 with a predetermined spacing therebetween (for example, the same as the spacing L0 of via contacts 13a, 13a).

The wiring layers 43a and 43b are held at a predetermined potential (for example, the ground potential).

The wiring layers 43a and 43b are not used as another signal line, and connected neither to the power supply nor to the ground in the macro cell 4C.

The wiring layer 43b has a width at least larger than the spacing between the wiring layers 43a.

Above the wiring layer 43b is formed a wiring layer 43c, for example, as a signal line via a inter-layer insulation film 9b.

In the shield portion 42 is formed a wiring layer 41 between the wiring layers 43a on the substrate 2. In the present embodiment, the wiring layer 41 is connected to a circuit outside the macro cell 4C but not to an element or a terminal inside the macro cell 4C.

As shown in FIG. 10, the shield portion 5C surrounding the macro cell 4C has a notch through which the wiring layer 41 passes.

The configuration of the present embodiment gives almost the same effects as those of the above-mentioned first embodiment.

Besides, by the present embodiment, noise is canceled at the interface between the inside and the outside of the macro cell 4C to thereby permit an external wiring to pass through the macro cell 4C along a shortest distance without bypassing it, thus improving the degree of freedom in designing.

Fifth Embodiment

Figure 12:
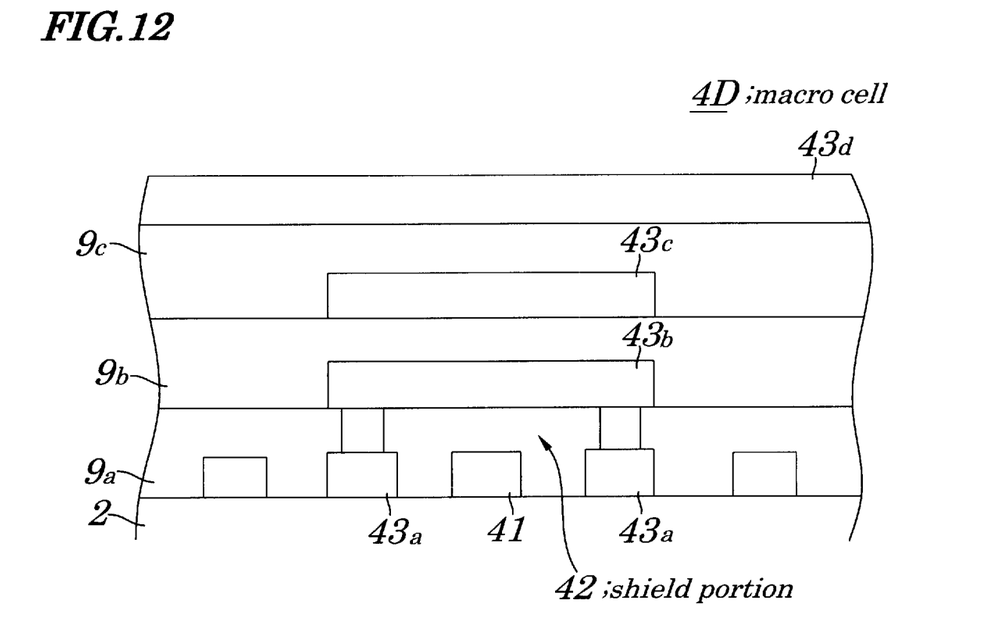
FIG. 12 is a cross-sectional view for showing a configuration of an important part of a macro cell and a shield portion of a semiconductor integrated circuit device according to a fifth embodiment of the present invention.

The present embodiment greatly differs from the above-mentioned fourth embodiment in a respect that additionally, as shown in FIG. 12, a macro cell 4D has a plate-shaped shield portion 43d which is formed above a wiring layer 43c via a inter-layer insulation film 9c so as to cover the macro cell 4D completely.

Except this point, the configuration of the present embodiment is roughly the same as that of the above-mentioned fourth embodiment and so its explanation is omitted here.

This configuration of the present embodiment gives almost the same effects as those of the above-mentioned fourth embodiment.

Besides, by the present embodiment, noise occurring in the macro cell 4D is blocked in propagation by the plate-shaped shield portion 43d and so does not affect a signal flowing through a wiring layer outside the macro cell 4D. It is thus possible to securely eliminate adverse effects which cause the malfunctioning of the other macro cells or functional blocks or the retardation or inversion of the signal.

Furthermore, noise coming toward the inside of the macro cell 4D from the above is blocked in propagation by the plate-shaped shield portion 43d, so that a signal flowing through a wiring layer in the macro cell 4D is not affected by noise originated from a wiring layer outside the macro cell.

It is apparent that the present invention is not limited to the above embodiments but may be changed and modified without departing from the scope and spirit of the invention.

For example, although the above-mentioned embodiments have provided the shield portion so as to surround the macro cell, the present invention may be applied not only to the macro cell but also to a mega-cell or any other functional blocks.

Although the above-mentioned embodiments have set the spacing between the via contacts 13a (13b) at a constant value, the spacing may be changed corresponding to, for example, a complexity and a site of the circuits.

Also, the via contacts 13a and the via contacts 13b may not always be at the same position but may be different in spacing.

Although the above-mentioned second embodiment has provided a notch in the shield portion 5A, a shield portion, if provided also on the upper surface side, may have a notch or an opening formed therein so that a signal-wiring layer can pass through it.

Although the above-mentioned fourth embodiment has provided a shield portion that shields an external wiring layer passing through the macro cell, the wiring layer may not pass through the macro cell or may be connected to a terminal or an element in it.

Although the fourth and fifth embodiments have arranged an external wiring layer in the lowermost layer, it may be arranged in an upper layer or step-wise in a plurality of layers.

Furthermore, the conductive material of the wiring layers is not limited to aluminum but may be chromium or copper.

What is claimed is:

1. A semiconductor integrated circuit device comprising:
   a functional block in which a plurality of semiconductor elements is formed on a semiconductor substrate and connected with each other by a multi-layer wiring; and
   a multi-layer shield portion which is arranged so as to surround said functional block and in which shielding wiring layers are stacked vertically via an inter-layer insulation film,
   wherein said multi-layer shield portion is provided with a plurality of via contacts for interconnecting upper layers and lower layers among said plurality of shielding wiring layers.

2. The semiconductor integrated circuit device according to claim 1, wherein said functional block is a macro cell.

3. The semiconductor integrated circuit device according to claim 1, wherein said via contacts are provided in a circumferential direction of said shielding wiring layers of said multi-layer shield portion with a predetermined spacing therebetween.

4. The semiconductor integrated circuit device according to claim 1, wherein said via contacts are provided so as to be connected with each other from
   an uppermost shielding wiring layer to a lowermost shielding wiring layer making up said multi-layer shield portion at an approximately same position as viewed in a plane.

5. The semiconductor integrated circuit device according to claims 1, wherein said multi-layer shield portion has a notch through which a wiring layer can pass so as to connect to a terminal provided in said functional block.

6. The semiconductor integrated circuit device according to claims 1, wherein each of said shielding wiring layers of said multi-layer shield portion is formed in a same layer as corresponding one of said multi-layer wirings of said functional block.

7. The semiconductor integrated circuit device according to claims 1, wherein said multi-layer shield portion is supplied with a predetermined potential but has each of said shielding wiring layers thereof not connected to a power supply terminal or a ground terminal connected to said semiconductor elements formed in said functional block.

8. The semiconductor integrated circuit device according to claims 1, further comprising a plate-shaped shield portion formed of a plate-shaped shielding wiring layer that covers a top surface of said functional block partially or completely.

9. The semiconductor integrated circuit device according to claim 8, wherein said plate-shaped shield portion is supplied with a predetermined potential but not connected to the power supply terminal or the ground terminal connected to said semiconductor elements formed in said functional block.

10. The semiconductor integrated circuit device according to claims 1, wherein:
    a tunnel-shaped shield portion is provided in said functional block for accommodating an external wiring layer connected to a circuit outside said functional block in such a manner that said external wiring layer may pass through said functional block along said semiconductor substrate; and
    said tunnel-shaped shield portion is provided along a wiring path of said external wiring layer above said external wiring layer, having an upper-part shielding wiring layer consisting of an elongated plate-shaped wiring layer, one pair of side-part shielding wiring layers provided each on two sides of said external wiring layer and arranged parallel to said external wiring layer, and a plurality of via contacts for interconnecting said upper-part shielding wiring layer and each of said side-part shielding wiring layers.

11. The semiconductor integrated circuit device according to claim 10, wherein said external wiring layer is arranged in a layer except a lowermost layer on said semiconductor substrate and has below a lower-part shielding wiring layer formed of an elongated plate-shaped wiring layer along a path of said external wiring layer.

12. The semiconductor integrated circuit device according to claim 10, wherein said tunnel-shaped shield portion is supplied with a predetermined potential but not connected to the power supply terminal or the ground terminal connected to said semiconductor elements formed in said functional block.

* * * * *